United States Patent
Epler

(10) Patent No.: US 9,583,679 B2
(45) Date of Patent: *Feb. 28, 2017

(54) P-CONTACT WITH MORE UNIFORM INJECTION AND LOWER OPTICAL LOSS

(71) Applicant: KONINKLIJKE PHILIPS N.V., Eindhoven (NL)

(72) Inventor: John Edward Epler, San Jose, CA (US)

(73) Assignee: Koninklijke Philips N.V., Eindhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/071,792

(22) Filed: Mar. 16, 2016

(65) Prior Publication Data

US 2016/0197240 A1 Jul. 7, 2016

Related U.S. Application Data

(63) Continuation of application No. 14/355,619, filed as application No. PCT/IB2012/055970 on Oct. 29, 2012, now Pat. No. 9,312,437.

(Continued)

(51) Int. Cl.
*H01L 21/00* (2006.01)
*H01L 33/00* (2010.01)
(Continued)

(52) U.S. Cl.
CPC .............. *H01L 33/40* (2013.01); *H01L 33/14* (2013.01); *H01L 33/145* (2013.01); *H01L 33/18* (2013.01); *H01L 33/38* (2013.01)

(58) Field of Classification Search
CPC .............................. H01L 33/14; H01L 33/145
(Continued)

(56) References Cited

U.S. PATENT DOCUMENTS 5,696,389 A 12/1997 Ishikawa et al.
5,789,768 A 8/1998 Lee et al.
(Continued)

FOREIGN PATENT DOCUMENTS

EP 0650202 A1 4/1995
EP 2249405 A2 10/2010
(Continued)

OTHER PUBLICATIONS

Rogers et al., "Low Growth Temperature AlGaAs Current Blockin gLayers for Use in Surface Normal Optoelectronic Devices," Journal of Vacuum Science and Technology, vol. 11, No. 3, May 1, 1993, pp. 926-928.
(Continued)

*Primary Examiner* — Calvin Lee

(57) ABSTRACT

The current distribution across the p-layer (130) of a semiconductor device is modified by purposely inhibiting current flow through the p-layer (130) in regions (310) adjacent to the guardsheet (150), without reducing the optical reflectivity of any part of the device. This current flow may be inhibited by increasing the resistance of the p-layer that is coupled to the p-contact (140) along the edges and in the corners of contact area. In an example embodiment, the high-resistance region (130) is produced by a shallow dose of hydrogen-ion (H+) implant after the p-contact (140) is created. Similarly, a resistive coating may be applied in select regions between the p-contact and the p-layer.

19 Claims, 1 Drawing Sheet

Related U.S. Application Data

(60) Provisional application No. 61/556,343, filed on Nov. 7, 2011.

(51) Int. Cl.
*H01L 33/40* (2010.01)
*H01L 33/14* (2010.01)
*H01L 33/18* (2010.01)
*H01L 33/38* (2010.01)

(58) Field of Classification Search
USPC .............................................. 438/29; 257/98
See application file for complete search history.

(56) References Cited

U.S. PATENT DOCUMENTS

| | | | |
|---|---|---|---|
| 6,492,661 | B1 | 12/2002 | Chien et al. |
| 6,828,596 | B2 | 12/2004 | Steigerwald |
| 7,759,670 | B2 | 7/2010 | Liu et al. |
| 7,764,721 | B2 | 7/2010 | Chua |
| 7,943,954 | B2 | 5/2011 | Wu |
| 8,222,661 | B2 | 7/2012 | Hwang |
| 8,791,481 | B2 | 7/2014 | Song |
| 9,312,437 | B2 * | 4/2016 | Epler .............. H01L 33/145 438/29 |
| 2005/0285126 | A1 | 12/2005 | Wu et al. |
| 2007/0114545 | A1 | 5/2007 | Jang et al. |
| 2008/0217635 | A1 | 9/2008 | Emerson et al. |
| 2010/0084675 | A1 | 4/2010 | Ueno et al. |
| 2014/0264430 | A1 | 9/2014 | Epler |

FOREIGN PATENT DOCUMENTS

| | | |
|---|---|---|
| EP | 2287923 A1 | 2/2011 |
| EP | 2315276 A1 | 4/2011 |
| JP | 2000174340 A | 6/2000 |
| JP | 2002064221 A | 2/2002 |
| JP | 2002170990 A | 6/2002 |
| JP | 2005072603 A | 3/2005 |
| JP | 2005159299 A | 6/2005 |
| JP | 2005268642 A | 9/2005 |
| JP | 2009033157 A | 2/2009 |
| JP | 2010529697 A | 8/2010 |
| KR | 101054169 | 8/2011 |
| WO | 02056386 A1 | 7/2002 |

OTHER PUBLICATIONS

EPO as ISA, International Search Report and Written Opinion mailed Feb. 14, 2013 from International Application No. PCT/IB2012/055970 filed Oct. 29, 2012, 12 pages.
CN Office Action, Application 201280054659.4, Jun. 14, 2016, 16 pps.
Office Action dated Jun. 17, 2016, European Application Patent Application No. 12812345.2 filed Oct. 29, 2012, 8 pgs.
Office Action mailed Aug. 9, 2016, Japan Application No. 2014-539445 filed Oct. 29, 2012, 8 pps.
TW offfice action, Application 101141427, Jun. 27, 2016, 9 pps.

* cited by examiner

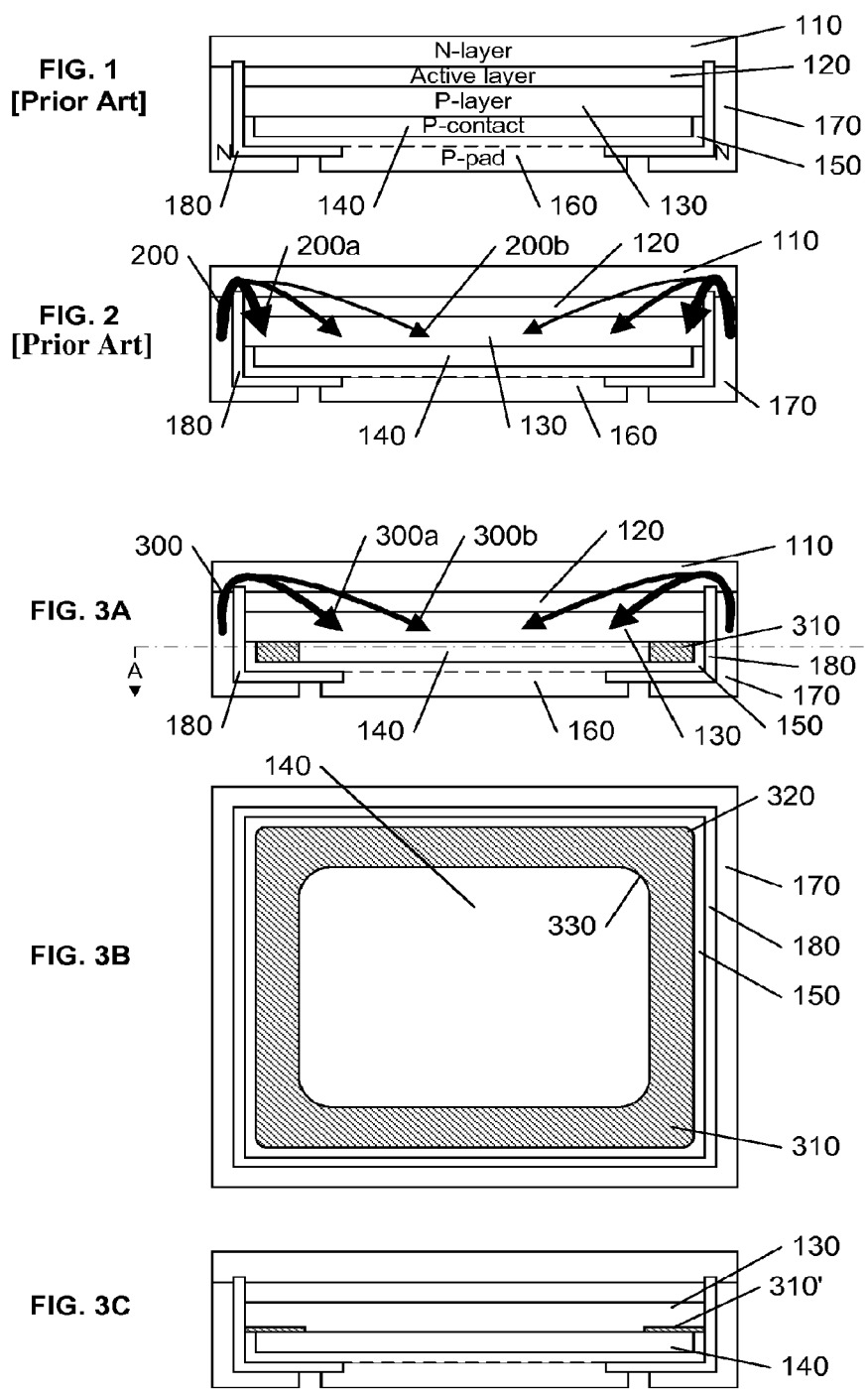

ns of the device. Therefore, current injected at the edge of the p-contact will exhibit a lower external quantum efficiency than current injected at the center area of the p-contact.

Despite the greater optical loss of the edges and corners of the device, the inventors have also noticed that more emitted light is produced at the periphery and in the corners than at the center of the device, because the voltage drop associated with the lateral flow of current through the n-contact layer, combined with the exponential dependence of vertical current flow upon junction voltage, provides a significantly higher current density at the edges and in the corners of the device. These relatively high injection currents create a slight halo-effect, with bright areas in the corners of the device.

In addition to potentially introducing optical anomalies, such a non-uniform current injection pattern is inefficient, as the internal quantum efficiency is lower for higher current densities. The 'over-emitting' portions, particularly the corners, of the light emitting device will also be 'hot-spots' that draw more current in the device, which have been observed to lead to premature failure of devices operated at high current.

P-CONTACT WITH MORE UNIFORM INJECTION AND LOWER OPTICAL LOSS

CROSS-REFERENCE TO RELATED APPLICATIONS

The present application is a continuation of U.S. application Ser. No. 14/355,619, filed on May 1, 2014, which is a §371 application of International Application No. PCT/IB2012/055970, filed on Oct. 29, 2012, which claims the benefit of U.S. Provisional Application No. 61/556,343, filed on Nov. 7, 2011. Ser. No. 14/355,619, PCT/IB2012/055970, and 61/556,343 are incorporated herein.

FIELD OF THE INVENTION

This invention relates to the field of semiconductor light emitting devices, and in particular to techniques for improving extraction efficiency and providing a more uniform current distribution across the light emitting region of the device.

BACKGROUND OF THE INVENTION

The substantial increase in demand for semiconductor light emitting devices, and the corresponding increase in competition to satisfy demand has caused manufacturers to seek techniques that will reduce costs or improve performance. Of particular note, techniques that improve the efficiency or quality of the emitted light may serve to distinguish one competitor's product from the others.

FIG. 1 illustrates an example prior art Thin Film Flip Chip (TFFC) InGaN Light Emitting Device (LED), such as disclosed in U.S. Pat. No. 6,828,596, "CONTACTING SCHEME FOR LARGE AND SMALL AREA SEMICONDUCTOR LIGHT EMITTING FL1p-CHIP DEVICES", issued to Daniel A. Steigerwald, Jerome C. Bhat, and Michael J. Ludowise, and incorporated by reference herein.

In this example device, a light emitting layer 120 is formed between an n-layer 110 and a p-layer 130. An external power source (not illustrated) provides power to the device via connections to pads 160 and 170. The p-pad 160 is coupled to the p-layer 130 via a p-contact 140, through an optional guard layer 150 that inhibits migration of the p-contact material. The n-contact layer 170 is coupled directly to the n-layer 110 in this example. A boundary layer 180 isolates the n-contact layer 170 and n-layer 110 from the p-layer 130 and p-contact 140.

The p-contact 140 is provided over a large area to facilitate a uniform distribution of current through the p-layer 130, which has a relatively higher resistance to current flow. The n-layer 110 does not exhibit a high resistance, and thus the n-contact covers a smaller area, which may be 10% or less of the device area. The p-contact 140 is preferably highly reflective to reflect the light toward the top, emitting surface of the light emitting device. Silver is commonly used as the p-contact 140. The n-contact layer is also reflective and metals such as Aluminum are preferred. The guard layer 150 may be metallic, but is only partially reflective as a suitable highly reflective metal has not yet been found for this application. This partially reflective guard sheet fills the area adjacent to the p-contact, resulting in higher optical loss at the p-contact periphery.

The inventors have recognized that the light generated within about 15 microns of the periphery of the p-contact may, with high probability, enter the guard layer area 150 and suffer optical absorption before having a chance to exit

SUMMARY OF THE INVENTION

It would be advantageous to distance the light emission regions away from the partially reflective guard layer and to further improve the uniformity of the injected current density light emissions across the surface of the active layer.

To better address these concerns and others, in an embodiment of this invention, the current distribution across the p-layer of a semiconductor device is modified by purposely inhibiting current flow through the p-layer in regions adjacent to the guardsheet, without reducing the optical reflectivity of any part of the device. This current flow may be inhibited by increasing the resistance of the p-layer that is coupled to the p-contact along the edges and in the corners of contact area. In an example embodiment, the high-resistance region is produced by a shallow dose of hydrogen-ion (H+) implant after the p-contact is created. Similarly, a resistive coating may be applied in select regions between the p-contact and the p-layer.

BRIEF DESCRIPTION OF THE DRAWINGS

The invention is explained in further detail, and by way of example, with reference to the accompanying drawings wherein:

FIG. 1 illustrates an example prior-art light emitting device.

FIG. 2 illustrates current distribution in the example light emitting device.

FIGS. 3A-3B illustrate an example light emitting device with a p-contact that includes a high resistance region and a low resistance region to improve current distribution.

FIG. 3C illustrates an alternative to FIG. 3A.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

This invention is presented in the context of the example prior art device of FIG. 1, for ease of illustration and understanding. One of skill in the art will recognize, however, that some or all of the principles of this invention may be applicable to a variety of different LED structures, or any structures that would benefit from a reduction in optical loss created by an absorbing region adjacent to a low loss current injection region.

As noted above, the light emitting device of FIG. 1, the structure of which is repeated in FIGS. 2 and 3, includes a highly reflective, large area p-contact 140 that provides for a more uniform distribution of current through the p-layer 130. The contact between the n-layer 110 and the n-pad 170 is along the perimeter of the n-layer 110. A boundary layer 180 separates the n-type elements 110, 180 from the p-type elements 130, 140, 150.

As illustrated in FIG. 2, when connected to an external source via the n-pad 170 and p-pad 160, the electron current 200 from the n-pad 170 spreads laterally through the n-layer 110, crossing the boundary layer 180 and continuing down toward the p-contact 140 and the p-pad 160. Because the current distribution across the n-layer 110 is not perfectly uniform, and because distance from the perimeter of the p-contact 140 and the source of the current 200 is shorter than the distance from the center of the p-contact 140, the current flow 200a to the perimeter of the p-contact 140 will be greater than the current flow 200b to the center of the p-contact 140. Depending upon geometry (corner vs. edge), n-GaN sheet resistance (thickness and doping), and operating conditions (current, temperature), a substantial fraction 200a of the current injection 200 may be concentrated near the boundary of the p-contact 140. Accordingly, the current injection through the p-n junction of active layer 120 will be larger around the periphery of the active layer 120, creating a higher emission of light at the periphery.

In addition to potentially objectionable optical effects caused by this non-uniform light emission, this non-uniformity potentially reduces the overall light extraction efficiency, because the higher light emission occurs in regions where the optical losses are greatest. At the center of the light emitting active layer 120, most of the emitted light will eventually exit the top surface of the light emitting device, either directly, or via reflections from the p-contact layer 140. Light that is emitted from the center of the active layer 120 at severe angles (side-light) relative to the top surface will have a greater likelihood of exiting the top surface of the device than such light from other regions, because, from the center, there is less likelihood of encountering a light absorbing feature, such as the boundary layer 180, before exiting the top surface. Conversely, along the perimeter of the active layer 120, the likelihood of encountering the boundary layer 180 is significantly higher, with a corresponding increase in optical loss.

In addition to the optical problems associated with the non-uniform current flow, the larger current flow 200a creates a "hot spot" that lowers the bandgap and draws even more current, resulting in the creation of failure prone areas in the device.

Additionally, the uneven current injection into the light emitting region also reduces the overall chip internal quantum efficiency (IQE; a ratio of the number of photons emitted per injected electron), because the IQE decreases as the current density increases (known in that art as "IQE droop").

In an embodiment of this invention, hole current injection is inhibited in the periphery region 310 of the p-contact 140, as illustrated in FIGS. 3A-3B, FIG. 3B being a cross section A-A' of the device of FIG. 3A. This hole current injection inhibition region 310 may be formed by using, for example, a shallow low dose H+ implant, or other means of reducing, or blocking, current flow in this region. Such an implant may be performed after a silver deposition to form the p-contact 140, using a photo-resist pattern to form the region 310 that is subsequently processed to create the current-inhibiting region 310. Sufficient energy and dose for this purpose depends upon the Ag thickness but a 15 keV energy and a dose of 2e14 cm-2 are nominal values. High energy that implants deeper than 50 nm into the p-layer and high doses will create excessive damage in the p-layer and increase optical absorption.

Other means of inhibiting current flow to the p-layer 130 at the periphery may also be used, such as coating the periphery of the p-contact 140 with a resistive material 310', such as a dielectric or other poorly conductive transparent material, as illustrated in FIG. 3C. The p-contact layer 140 may run up over the edge of the dielectric layer 310' overlapping 310' to an extent of at least 5 μm, creating in the overlapped areas a highly reflective Ag-dielectric mirror.

By inhibiting the current flow in the region 310, the source current 300 is forced to be laterally diverted further through the n-layer 110, as illustrated by the current flows 300a, 300b in FIG. 3A. Because of the lateral diversion from the periphery of the p-contact 140, the current 300a flows farther through the n-layer 110 before reaching the p-contact 140 than the current 200a in FIG. 2, and will correspondingly be reduced in magnitude. This reduction in current magnitude at the periphery will reduce the 'hot-spot' associated with the high current 200a, and will reduce the likelihood of premature failure caused by the high current 200a.

The reduction in current at the periphery of the p-contact 140 will correspondingly provide an increase in the current 300b that flows to the center of the light emitting layer 120, compared to the current 200b in FIG. 2. The overall effect, for the same amount of total current in FIGS. 2 and 3, is a more uniform excitation of the light emitting layer 120 of FIG. 3, which provides for a more uniform light output from the device of FIG. 3.

Additionally, by laterally shifting the current away from the periphery of the p-contact 140, the edge of the light emission region is relocated away from the absorbing guard region 150, thereby reducing the amount of light that is lost to this region 150.

It is desirable to maintain as small a radius of curvature as possible at the outer corners 320 of the p-contact layer, so as to provide a maximal reflective area below the light emitting layer 120, thereby minimizing losses for any backscattered light. However, in a conventional device, a small radius of curvature maximizes the current crowding in the corners 320 of the device, causing even greater local hotspots at the corners. A reduction in the likelihood of local hot-spots may also be achieved by rounding the inner corners 330 of the inhibition region 310. By creating a current inhibiting region of larger radius of curvature at the corner 330 upon a p-contact layer with a small radius of curvature at the corners 320, the optical efficiency is maintained, and hot spots are mitigated.

While the invention has been illustrated and described in detail in the drawings and foregoing description, such illustration and description are to be considered illustrative or exemplary and not restrictive; the invention is not limited to the disclosed embodiments.

For example, it is possible to operate the invention by situating a contact enhancing layer, such as NiO, beneath the regions of the Ag contact where an enhanced contact is desired and eliminating this layer in the regions where the enhancement is not desired. This embodiment may be combined with a reduction in Mg doping or other impairment in the typical p-contact to reduce the effectiveness of the Ag—GaN contact.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method comprising:
   creating a light emitting element comprising an active region between an n-layer and a p-layer,
   providing a p-contact to the p-layer, the p-contact being coupled to the p-layer,
   creating a current-inhibiting region by using a shallow low dose ion implantation in a periphery of the p-contact, wherein the current-inhibiting region provides a non-uniform current flow from the p-contact to the p-layer,
   providing a p-pad coupled to the p-contact to facilitate coupling to an external source of power, and
   providing an n-pad coupled to the n-layer to facilitate coupling to the external source of power.

2. The method of claim 1, wherein the p-contact includes silver.

3. The method of claim 1, wherein the current-inhibiting region corresponds to a periphery of the p-contact.

4. The method of claim 1, wherein the current-inhibiting region includes curved corners with a radius of curvature greater than a radius of curvature of the p-contact.

5. The method of claim 1, wherein the current-inhibiting region corresponds to a region of the p-contact closest to a contact region between the n-pad and the n-layer.

6. A method comprising:
   creating a light emitting element comprising an active region between an n-layer and a p-layer,
   providing a p-contact to the p-layer, the p-contact being coupled to the p-layer,
   creating a current-inhibiting region by providing a material that improves ohmic contact about a center of the p-contact, omitting the material from the periphery of the p-contact, and reducing a doping of the periphery the p-contact, wherein the current-inhibiting region provides a non-uniform current flow from the p-contact to the p-layer,
   providing a p-pad coupled to the p-contact to facilitate coupling to an external source of power, and
   providing an n-pad coupled to the n-layer to facilitate coupling to the external source of power.

7. The method of claim 6, wherein the material that improves ohmic contact includes NiO.

8. A light emitting device comprising:
   an n-layer,
   a p-layer,
   a light emitting layer between the n-layer and the p-layer,
   an n-pad for coupling to the n-layer,
   a p-pad for coupling to the p-layer, and
   a p-contact that couples the p-pad to the p-layer to facilitate a current injection through the p-layer,
   wherein the p-contact is configured to inhibit the current injection through the p-layer in a current-inhibiting region of the p-contact, and the current-inhibiting region includes a shallow low dose ion-injected region in the p-contact.

9. The light emitting device of claim 8, wherein the current-inhibiting region corresponds to a region of the p-contact that provides a maximum current injection in the absence of the current-inhibiting region.

10. The light emitting device of claim 8, wherein the current-inhibiting region corresponds to a periphery of the p-contact.

11. The light emitting device of claim 8, wherein the p-contact includes silver.

12. The light emitting device of claim 8, wherein the current-inhibiting region includes curved corners with a radius of curvature greater than a radius of curvature of the p-contact.

13. The light emitting device of claim 8, wherein the current-inhibiting region corresponds to a region of the p-contact closest to a contact region between the n-pad and the n-layer.

14. The light emitting device of claim 8, wherein the current-inhibiting region of the p-contact serves to improve uniformity of the current injection through the light emitting layer.

15. A light emitting device comprising:
    an n-layer,
    a p-layer,
    a light emitting layer between the n-layer and the p-layer,
    an n-pad for coupling to the n-layer,
    a p-pad for coupling to the p-layer, and
    a p-contact that couples the p-pad to the p-layer to facilitate a current injection through the p-layer,
    wherein the p-contact is configured to inhibit the current injection through the p-layer in a current-inhibiting region at a periphery of the p-contact, the p-contact is reflective of light emitted by the light emitting layer and the current-inhibiting region includes a substantially transparent resistive coating between the p-contact and the p-layer.

16. The light emitting device of claim 15, wherein the current-inhibiting region of the p-contact serves to improve uniformity of the current injection through the light emitting layer.

17. A light emitting device comprising:
    an n-layer,
    a p-layer,
    a light emitting layer between the n-layer and the p-layer,
    an n-pad for coupling to the n-layer,
    a p-pad for coupling to the p-layer, and
    a p-contact that couples the p-pad to the p-layer to facilitate a current injection through the p-layer, wherein the p-contact is configured to inhibit the current injection through the p-layer in a current-inhibiting region at a periphery of the p-contact, the p-contact includes a material that improves an ohmic contact about a center of the p-contact, and the current-inhibiting region corresponds to an absence of this material and a reduced doping at the periphery of the p-contact.

18. The light emitting device of claim 17, wherein the material that improves the ohmic contact includes NiO.

19. The light emitting device of claim 17, wherein the current-inhibiting region of the p-contact serves to improve uniformity of the current injection through the light emitting layer.

* * * * *